United States Patent [19]

Manocha

[11] Patent Number: 4,807,013
[45] Date of Patent: Feb. 21, 1989

[54] POLYSILICON FILLET

[75] Inventor: Ajit S. Manocha, Allentown, Pa.

[73] Assignee: American Telephone and Telegraph Company AT&T Bell Laboratories, Murray Hill, N.J.

[21] Appl. No.: 37,090

[22] Filed: Apr. 8, 1987

Related U.S. Application Data

[63] Continuation of Ser. No. 661,776, Oct. 17, 1984, abandoned.

[51] Int. Cl.$^4$ ............... H01L 29/78; H01L 29/04; H01L 23/48
[52] U.S. Cl. .................... 357/59; 357/23.1; 357/65; 357/68; 357/71
[58] Field of Search ............. 357/23.1, 23.3, 23.9, 357/42, 59, 65, 68, 71, 91, 23.7, 34, 41

[56] References Cited

U.S. PATENT DOCUMENTS

| | | | |
|---|---|---|---|
| 4,234,362 | 11/1980 | Riseman | 148/187 |
| 4,312,680 | 1/1982 | Hsu | 357/59 |
| 4,319,261 | 3/1982 | Kub | 357/59 |
| 4,329,706 | 5/1982 | Crowder et al. | 357/23.9 |
| 4,374,700 | 2/1983 | Scott et al. | 357/59 |
| 4,406,051 | 9/1983 | izuka | 357/59 |
| 4,419,809 | 12/1983 | Riseman | 29/571 |
| 4,478,679 | 10/1984 | Chang et al. | 357/23.9 |
| 4,507,171 | 3/1985 | Bhatia et al. | 357/65 |
| 4,507,853 | 4/1985 | McDavid | 357/68 |
| 4,691,435 | 9/1987 | Anantha et al. | 437/162 |

OTHER PUBLICATIONS

F. Barson, "Modified Polysilicon Emitter Process", *IBM Technical Disclosure Bulletin*, vol. 22 (1980) pp. 4052–4053.

P. J. Tsang, "Method of Forming Poly-si Pattern with Tapered Edge", IBM Technical Disclosure Bulletin, vol. 19 (1976) pp. 2047–2048.

W. R. Hunter et al, "A New Edge-Defined Approach For Submicrometer MOSFET Fabrication", *IEEE Electron Device Letters*, vol. EDL-2, No. 1 (Jan., 1981) pp. 4–6.

Primary Examiner—J. Carroll
Attorney, Agent, or Firm—John T. Rehberg

[57] ABSTRACT

Disclosed is an integrated circuit manufacturing technique that relies on the use of polysilicon fillets for overcoming the well known adverse effects of steep sidewalls produced by anisotropic etching processes and undercuts produced by anisotropic etching of multilayers.

8 Claims, 3 Drawing Sheets

POLYSILICON FILLET

This application is a continuation, of application Ser. No. 661,776, filed Oct. 17, 1984 abandoned,

BACKGROUND OF THE INVENTION

The advent of anisotropic etching processes in silicon integrated circuit technology has reduced feature sizes and allowed higher density packing of circuit elements. Anisotropic etching processes allow openings to be made in dielectric layers, and metalization patterns to be formed, in each case with essential vertical sidewalls, so the size of the openings, and the lateral dimensions of the patterns can be made optimally small, e.g. the minimum line width allowed by the lithography rules. Attending this advance is a drawback. The steep, near vertical, sidewalls are difficult to cover with the the next layer, and they also present sites, sometimes reentrant sites, where residue remains after a layer has been etched. These problems are well known and widely documented, and a variety of proposals have been put forward for overcoming the "severe step" problem. One of those proposals is to construct a sidewall oxide at the steep edge to smooth the sidewall for the next deposited layer. Such an approach is described and claimed in my copending application Ser. No. 661,614, filed Oct. 17, 1984 and now abandoned. The sidewall oxide is formed by an anisotropic etching process that has become widely used in the so-called "lightly doped drain" (LDD) transistor structure.

I have found that oxide sidewall fillers have limitations in certain applications that prevent their effective use. For example, if the sidewall to be covered has an underlying oxide layer, the prior art oxide sidewall approach involves etching an oxide layer to form the sidewall in the presence of the oxide underlayer, and results in removal of the underlayer unless very precise control is exercised, control that may be impractical in a manufacturing environment. Consequently, when it is necessary to preserve the underlying oxide layer, the oxide sidewall cannot be used effectively. A variety of reasons may arise for retaining that oxide. For example, it is known that exposure of bare silicon to RIE environment can create defects in the silicon that impair device performance. A number of other reasons may arise for creating an alternative approach to sidewall coverage.

STATEMENT OF THE INVENTION

I have developed a new solution to the "severe step" problem. It is based on the use of a polysilicon fillet in the corner formed by the step. The polysilicon fillet is formed by an anisotropic etch process which gives the advantage of high selectivity with respect to the commonly used dielectric materials. The polysilicon fillet can be used in conjunction with steps of polysilicon or dielectric materials, e.g. silicon dioxide, silicon nitride. It can be used with refractory metal steps, e.g. titanium, tungsten, molybdenum, cobalt, with silicides of these refractory metals, or with polycides. It is especially useful for sidewalls of etched composite layers where an undercut of the underlying layer of the composite often develops.

DETAILED DESCRIPTION

The invention will be described in the context of a specific sequence of processing steps however will be understood not to be restricted to that or another particular sequence.

The objective of the following sequence is to form a multilayer structure in which the uniformity and continuity of the layers is optimized.

Figure 1:
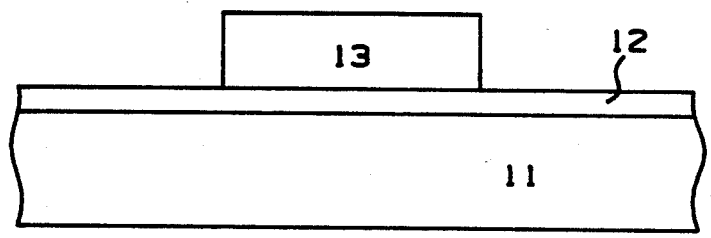
FIGS. 1–4 are schematic representations of a series of exemplary fabrication steps useful for realizing the advantages of the invention.
Figure 2:
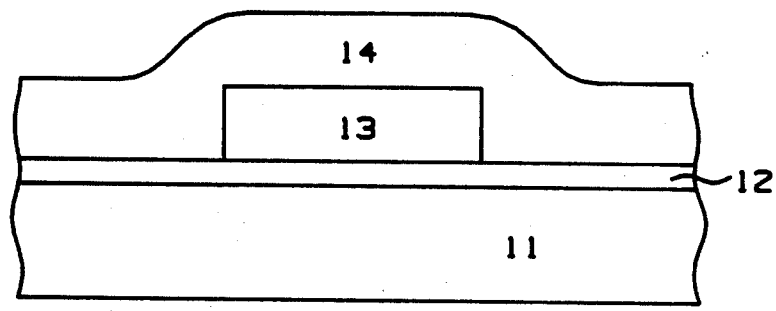
Figure 3:
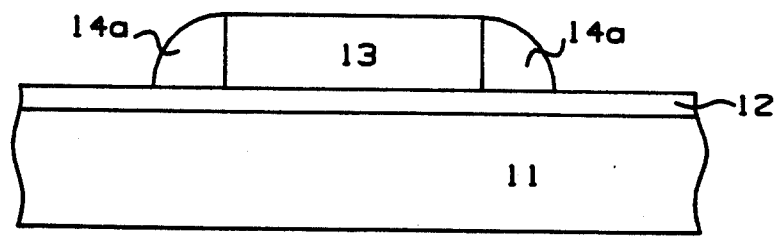
Figure 4:
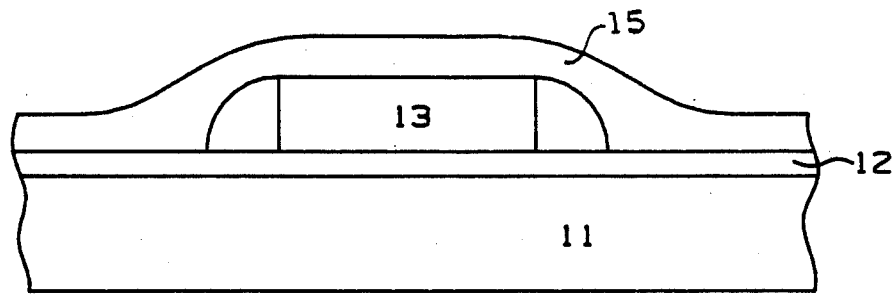

With reference to FIG. 1 there is shown a semiconductor substrate 11, typically silicon, having a first layer 12, typically a dielectric layer like silicon dioxide, formed thereover. A device feature 13 is formed on the substrate 11. This feature may be one of a variety of functional elements and may comprise any of a variety of materials. Most typically it is a polysilicon feature, either a gate electrode or a polysilicon interconnect. It may also be the edge of a dielectric layer, e.g. a field oxide. All are characterized by a relatively steep sidewall that presents an obstacle to coverage by a subsequent layer or layers, and/or creates associated problems, e.g. so-called "stringers" that develop in reentrant sidewalls and cause interconductor shorts. Layers such as layer 12 that are patterned using anisotropic etching processes are especially susceptible to these problems. Anisotropic eteching processes will be ubiquitous in VLSI technology because they optimize miniaturization. Consequently, the sidewall shown in FIG. 1 is essentially vertical to substrate 11. This feature may be one of a variety of functional elements, e.g. it may be a gate dielectric, an interconnect, or an interlevel dielectric. The sequence of steps chosen to be described here includes the first dielectric layer 12. However, the polysilicon fillet structure to be described, and which forms the basis of the invention, is also useful in connection with the edge of a dielectric layer, e.g. the edge of a field oxide, that is formed directly on the substrate 11. As may be inferred from the foregoing, the feature 13 may be any one of a variety of materials, e.g. polysilicon, silicon dioxide, silicon nitride, polycide (polysilicon and metal silicide composite), etc. Most advantageously it is polysilicon. A fillet forming layer 14 is deposited over the feature level 13 to completely enclose the sidewall of the feature in the manner shown in FIG. 2. The thickness of the fillet forming layer is preferably greater than the height of the sidewall to be covered, and preferably 1.5 to 3.0 times that thickness. Layer 14 is then anisotropically etched to remove portions of the layer leaving fillets 14a as shown in FIG. 3. Since the anisotropic process proceeds in an essentially vertical direction the effective thickness of the layer 14 at the sidewall is approximately twice the thickness of the remainder of the layer. Thus when the etching process clears at the horizontal portions, fillets like those shown in 14a remain. One of the advantages of the polysilicon fillet is evident at this stage in the process. The layer 12 may consist of a material, here silicon dioxide, with etch characteristics different from polysilicon allowing the polysilicon to be etched selectively with respect to this layer. Layer 12 is thus left intact during formation of the fillets. Using RIE anisotropic etching, the etch selectivity of polysilicon with respect to silicon dioxide is reliable, and effective patterning of the polysilicon is consistent with the formation of polysilicon fillets at the steps of underlying features. The next layer 15 is deposited over the resulting structure and forms with a relatively planarized configuration as shown in FIG. 4. This layer is typically an interlevel dielectric, and usually is silicon dioxide or silicon nitride. Subsequent layers of, e.g., polysilicon or metal and additional dielectric layers and passivating layers are typically formed to complete the device. One or more of these layers can be planarized using the technique just described.

An alternative to the formation of discrete fillets is described and claimed in my copending application Ser No. 661,614, filed Oct. 17, 1984 and now abandoned. with this application. Briefly, that approach achieves an equivalent planarized structure in a single step. The concept of sidewall fillets is present except that the fillets are embedded in the layer being formed and never emerge as discrete elements. This is illustrated for a planarized polysilicon layer in FIG. 5. Here the feature 53 is the edge of a field oxide layer, and the fillet forming layer 54 is so-called poly I, i.e., the first polysilicon layer of a device with double poly metallization. The layer 54 is deposited with a thickness substantially greater than the desired thickness and is partially back-etched. The structure that results has a fillet region inherently contained in layer 54 as shown at 54a, due again to the anisotropic nature of the etch step used.

Figure 6:
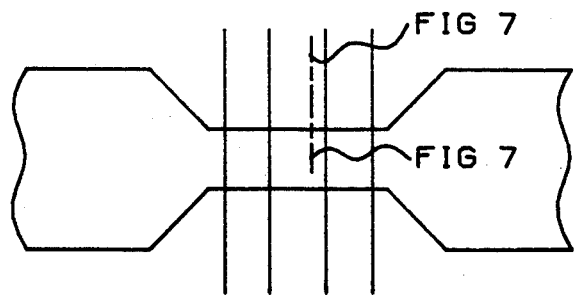
FIGS. 6–8 describe a preferred embodiment of the invention in connection with the fabrication of VLSLI memory devices.
Figure 7:
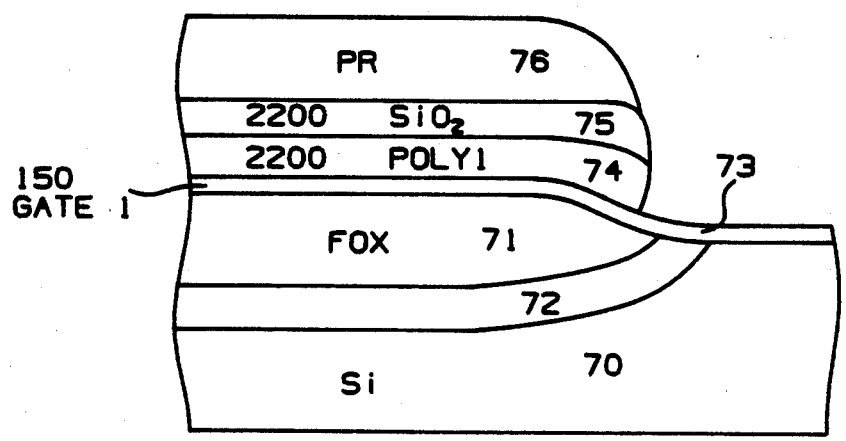
Figure 8:
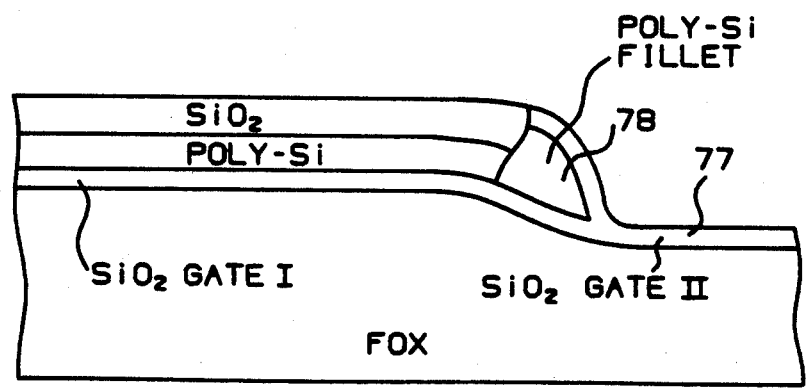

The following is given by way of example of one processing sequence described in connection with the structure shown in FIGS. 6 and 7. FIG. 6 identifies topologically the region of an integrated circuit, here a random access memory cell, where the invention has been used to advantage. The familiar paddle geometry of a single transistor memory cell is shown with gate runners crossing the gate regions of the side-by-side cells. The section shown in FIG. 7 is taken through this cell structure as indicated. In FIG. 7 the silicon substrate 70 is processed in a conventional manner to form field oxide 71 and underlying chan stop 72 as shown. Gate I oxide 73, of the order of a few hundred angstroms, and poly I, of the order of 1000 to 3000 Å, are formed. Interlevel dielectric 75, here silicon dioxide, also of the order of 1000 to 3000 Å is deposited. A photomask 76 is shown in place and this processing step illustrates the structure just after these layers have been anisotropically etched, resulting in the steep sidewall of layers 74 and 75. FIG. 8 shows gate II oxide 77 in place, typically with a thickness equal or larger than that of gate I. The polysilicon planarizing layer is then deposited and etched to form sidewall fillets 78 by the technique described above. Polysilicon is etched anisotropically by known techniques, e.g. with a chlorine gas etchant. The thickness of the polysilicon used to produce the fillets shown in FIG. 8 was of the order of 4000 Å As seen, the fillet in this case is formed abutting a composite layer, which is just as effective as forming a fillet abutting a single layer. It is also evident from FIG. 8 that it is not always necessary, or even desirable, that the fillet form to the top of the composite layer. Moreover, the sidewall in this case is not only steep but has an undercut portion due to imperfect anisotropic etching of the underlayer of the composite. Use of this invention is particularly advantageous with such composites. A composite frequently encountered in VLSI technology is polycide over polysilicon and an undercut of the polysilicon is typical as described in copending application of Ser. No. 661,779, filed Oct. 17, 1984 and now abandoned. filed herewith. Likewise, it is not essential that the fillet extend to the top of a single layer, i.e. a partial fillet is useful in some applications.

Figure 5:
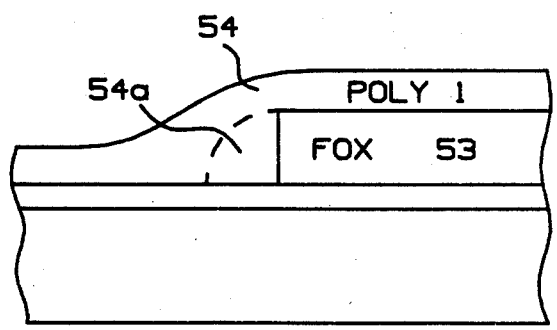
FIG. 5 is a representation of an alternative realization of the invention.

It should also be apparent that the fillet forming layer need not be etched completely so as to bare the horizontal surfaces of the fillet forming layer, i.e. the etch step may be a trade off between that described in connection with FIG. 3 and that described in connection with FIG. 5.

Various additional modifications and extensions of this invention will become apparent to those skilled in the art. All such variations and deviations which basically rely on the teachings through which this invention has advanced the art are properly considered to be within the spirit and scope of this invention.

What is claimed is:
1. Device comprising:
   a silicon substrate
   a plurality of layers covering the substrate, at least one of which is a patterned polysilicon layer resulting in a steep sidewall portion,
   a polysilicon fillet in the corner formed by the steep sidewall and the layer supporting it, said fillet and said polysilicon layer forming an interface, said fillet having a rounded surface, and
   at least one additional layer covering the polysilicon layer and the polysilicon fillet.
2. Device comprising:
   a silicon substrate,
   a dielectric layer covering at least portions of the substrate,
   a polysilicon conductor formed on the dielectric layer, said polysilicon conductor having at least one essentially vertical sidewall,
   a polysilicon fillet having a rounded surface and an interface with said conductor in the corner formed by the essentially vertical sidewall and the underlying dielectric layer.
3. Device of claim 2 including an additional dielectric layer covering the first recited dielectric layer and the polysilicon fillet.
4. Device of claim 3 in which the dielectric layers comprise silicon dioxide.
5. A device as recited in claim 1 in which one of said plurality of layers comprises at least one member selected from the group consisting of refractory metals and refractory metal silicides.
6. A device as recited in claim 1 in which at least two layers of said plurality are patterned to form steep sidewalls.
7. A device as recited in claim 6 in which said at least two layers comprise polysilicon and a dielectric.
8. A device as recited in claim 7 in which said dielectric comprises silicon dioxide.

* * * * *